(12) United States Patent
Yim

(10) Patent No.: US 8,409,927 B1
(45) Date of Patent: Apr. 2, 2013

(54) METHODS FOR FABRICATING INTEGRATED CIRCUIT SYSTEMS INCLUDING HIGH RELIABILITY DIE UNDER-FILL

(75) Inventor: Myung Jin Yim, Rexford, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 21 days.

(21) Appl. No.: 13/243,605

(22) Filed: Sep. 23, 2011

(51) Int. Cl.
*H01L 21/00* (2006.01)
(52) U.S. Cl. ......................................... 438/113; 438/464
(58) Field of Classification Search .................... None
See application file for complete search history.

(56) References Cited

U.S. PATENT DOCUMENTS

| | | | | |
|---|---|---|---|---|
| 2004/0121563 | A1* | 6/2004 | Farnworth et al. | 438/465 |
| 2005/0142837 | A1* | 6/2005 | Tsai et al. | 438/613 |
| 2008/0318396 | A1* | 12/2008 | Shin et al. | 438/462 |
| 2010/0047969 | A1* | 2/2010 | Kim et al. | 438/113 |
| 2010/0200986 | A1* | 8/2010 | Shin et al. | 257/737 |

* cited by examiner

*Primary Examiner* — Alonzo Chambliss
(74) *Attorney, Agent, or Firm* — Ingrassia Fisher & Lorenz, P.C.

(57) ABSTRACT

A method is provided for fabricating an integrated circuit system that includes fabricating a plurality of integrated circuits in and on a semiconductor substrate. Spaced apart solder bumps are attached to the plurality of integrated circuits, the solder bumps in electrical contact to components of the integrated circuits. A dicing tape having a layer of under-fill material thereon is provided and the semiconductor substrate is laminated to the dicing tape with the layer of under-fill material filling spaces between the solder bumps. The semiconductor substrate and layer of under-fill material are diced to singulate individual ones of the plurality of integrated circuits, and one of the individual ones of the plurality of integrated circuits is attached to a second substrate such as another integrated circuit chip or printed circuit board.

20 Claims, 6 Drawing Sheets

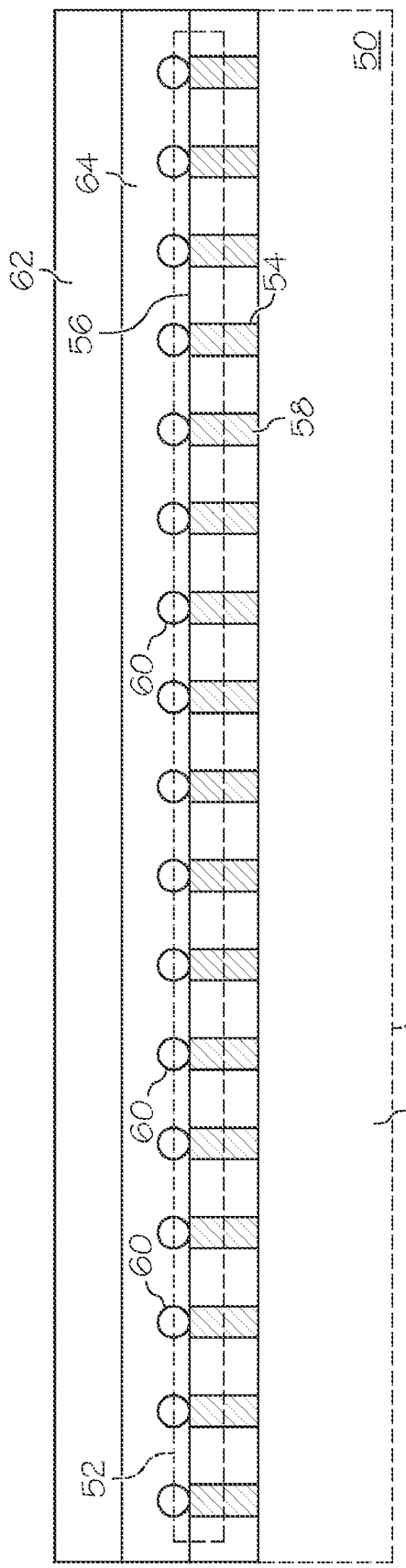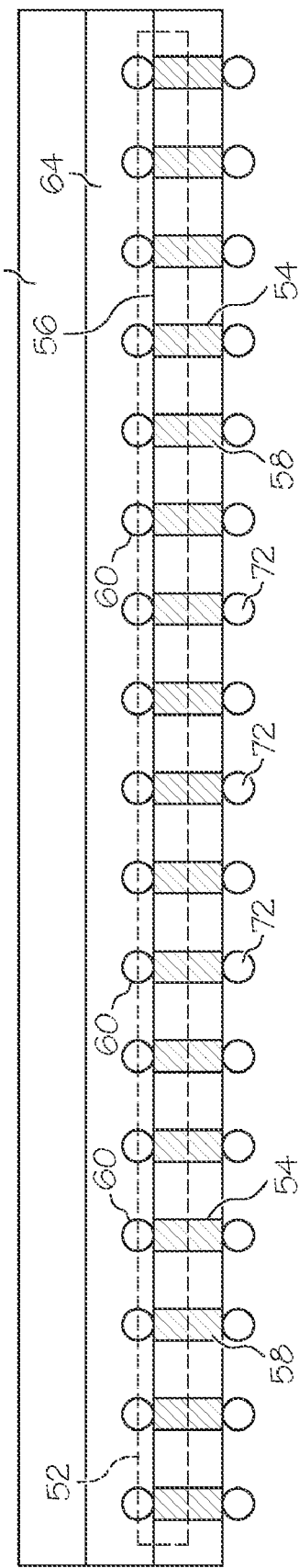

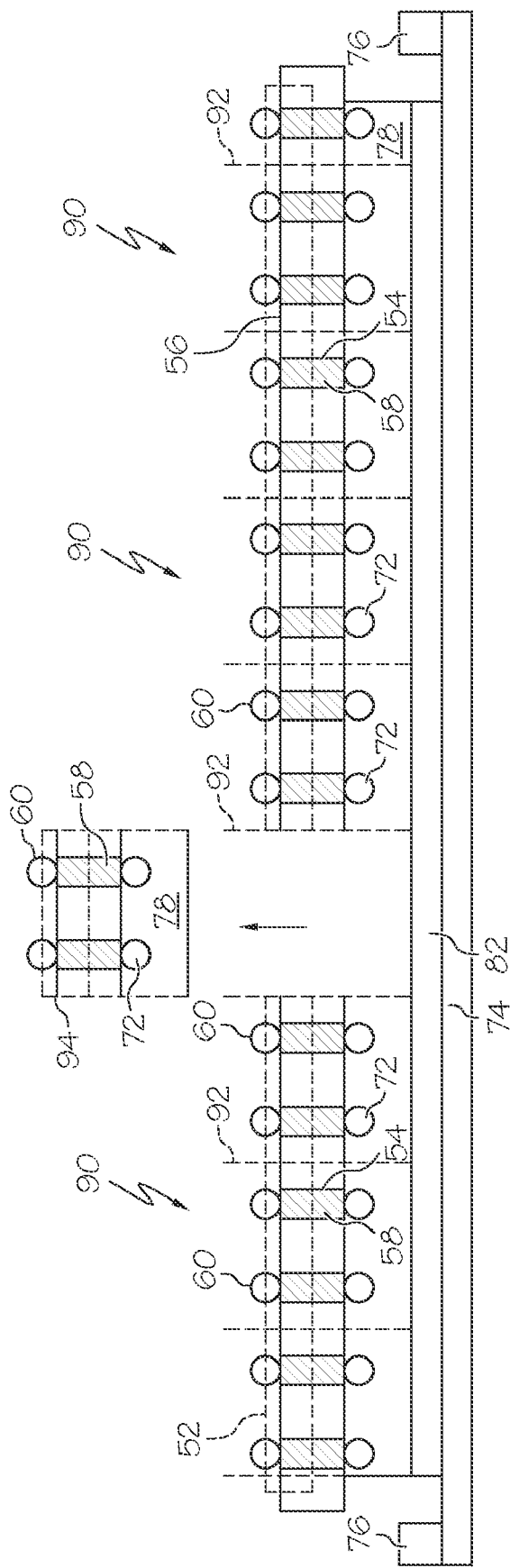
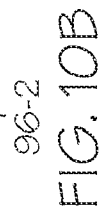
FIG. 9
FIG. 10A
FIG. 10B

US 8,409,927 B1

METHODS FOR FABRICATING INTEGRATED CIRCUIT SYSTEMS INCLUDING HIGH RELIABILITY DIE UNDER-FILL

TECHNICAL FIELD

The present invention generally relates to methods for fabricating integrated circuit systems, and more particularly relates to methods for fabricating integrated circuit systems having high reliability under-fill.

BACKGROUND

Integrated circuit systems often include integrated circuits (ICs) that are attached to other ICs, interposer boards, or printed circuit boards in a stacked relationship. The IC system can include, for example, microprocessor circuits, memory circuits, analog circuits, and the like that are interconnected to take advantage of the unique attributes of the individual circuits. By vertically stacking the system components the size or footprint of the system can be minimized.

The integrated circuit system includes at least one IC die that is bonded to another substrate by reflowing solder bumps to provide both physical attachment between the die and the substrate and electrical contact between the die and metallized pads on the substrate. The space between die and substrate must be filled with an under-fill material to protect the surface of the IC and to seal out contaminants. In advanced technologies it is difficult to properly fill the space between die and substrate because of the complex topologies involved, fine pitch between solder bumps, and narrow gap between the joined structures.

Accordingly, it is desirable to provide methods for fabricating integrated circuit systems that include reliable under-fill processes. In addition, it is desirable to provide methods for fabricating IC systems that are compatible with temporary bonding/debonding, wafer level under-fill, and dicing and singulation of IC chips. Furthermore, other desirable features and characteristics of the present invention will become apparent from the subsequent detailed description and the appended claims, taken in conjunction with the accompanying drawings and the foregoing technical field and background.

BRIEF SUMMARY

Methods are provided for fabricating an integrated circuit system. In accordance with one embodiment the method includes fabricating a plurality of integrated circuits in and on a semiconductor substrate. Spaced apart solder bumps are attached to the plurality of integrated circuits, the solder bumps being in electrical contact to components of the integrated circuits. A dicing tape having a layer of under-fill material thereon is provided and the semiconductor substrate is laminated to the dicing tape with the layer of under-fill material filling spaces between the solder bumps. The semiconductor substrate and layer of under-fill material are diced to singulate individual ones of the plurality of integrated circuits, and one of the individual ones of the plurality of integrated circuits is attached to a second substrate such as another integrated circuit chip or printed circuit board.

In accordance with a further embodiment the method includes fabricating integrated circuits in and on a semiconductor substrate. Fabricating the integrated circuits includes etching via openings into a front surface of the semiconductor substrate and filling the via openings with a conductive material to form through substrate vias. The front surface of the semiconductor substrate is bonded to a carrier wafer and the back side of the semiconductor substrate is polished to expose a portion of the conductive material. A plurality of solder bumps is formed on the back side in electrical contact with the conductive material. A dicing tape having a layer of under-fill material thereon is provided and the back side of the semiconductor substrate is laminated to the dicing tape. The semiconductor substrate is debonded from the carrier wafer and the semiconductor substrate and layer of under-fill material are diced into individual integrated circuit chips. Individual integrated circuit chips and under-fill material are then assembled to a second substrate In accordance with yet another embodiment the method includes fabricating a plurality of integrated circuits in and on a semiconductor substrate, each of the integrated circuits including a plurality of metal filled vias extending from a front surface toward a back surface and a plurality of solder bumps on the front surface, each in electrical contact with one of the plurality of metal filled vias. The front surface is bonded to a carrier wafer and the back surface is polished to thin the semiconductor substrate and to expose a portion of the plurality of metal filled vias. A redistribution layer is formed on the back surface in electrical contact with the exposed portion of the plurality of metal filled vias, and a plurality of back side solder bumps are formed in electrical contact with the redistribution layer. A dicing tape having a layer of under-fill material thereon is provided, and the back surface of the semiconductor substrate is laminated to the dicing tape, the under-fill material filling spaces between the back side solder bumps. The carrier wafer is removed and the semiconductor substrate and the layer of under-fill material are diced to divide the substrate into a plurality of individual integrated circuits. One of the plurality of individual integrated circuits is attached to a second substrate and is heated to cause the plurality of back side solder bumps to flow and to adhere to metallic pads on the second substrate.

BRIEF DESCRIPTION OF THE DRAWINGS

The present invention will hereinafter be described in conjunction with the following drawing figures, wherein like numerals denote like elements, and wherein:

FIGS. 1-10 schematically illustrate, in simplified cross-sectional views, method steps for fabricating an integrated circuit system in accordance with various embodiments.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIGS. 1-10 schematically illustrate, in simplified cross-sectional views, method steps for fabricating an integrated circuit system in accordance with various embodiments. As used herein, "integrated circuit system" means at least one integrated circuit (IC) chip or die that is bonded to a substrate which may be another chip, interposer layer, or printed circuit board. Although not illustrated, the IC system can include a plurality of IC chips, perhaps of different types such as microprocessor, memory, analog, or the like, that are stacked together to form a three dimensional system. Various steps in the manufacture of ICs and IC systems are well known to those of skill in the art and so, in the interest of brevity, many conventional steps will only be mentioned briefly herein or will be omitted entirely without providing the well known process details.

Figure 1:
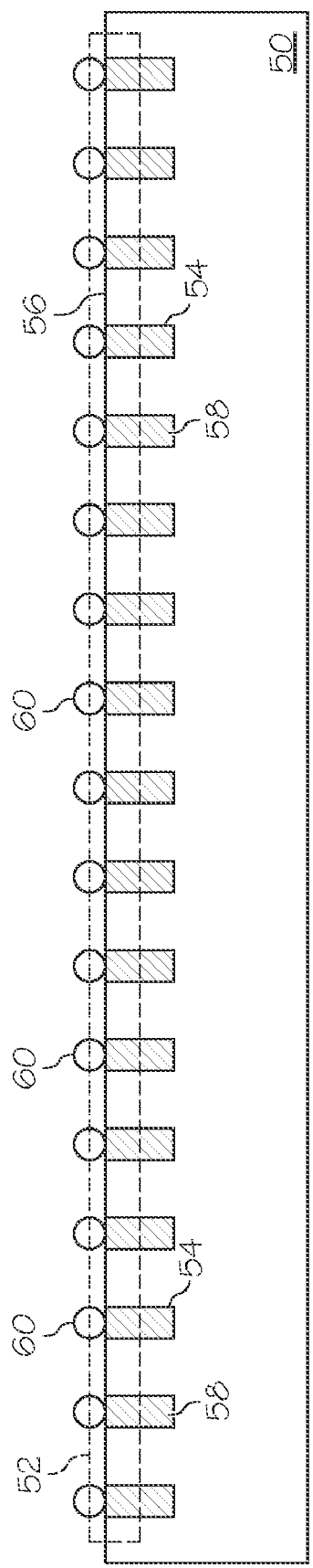

As illustrated in FIG. 1, the method in accordance with one embodiment begins by fabricating a plurality of integrated circuits in and on a semiconductor substrate 50. In this simplified cross-sectional view the plurality of integrated circuits are simply indicated by the single dashed area 52. As is well known, ICs are generally rectangular in form and are positioned on the semiconductor substrate in a regular array, each IC separated from the next by a scribe grid. As part of the method for fabricating stacked arrays of IC chips, a plurality of spaced apart via openings 54 are etched into the front surface 56 of the semiconductor substrate. The via openings can have a depth of, for example, 30-100 micrometers (μm). The via openings are filled with a conductive material 58 such as copper. The via openings, filled with a metal or other conductive material, will form through substrate vias (TSVs) that provide efficient means for interconnecting a plurality of chips and associated substrates. The filled vias can be formed at various times in the fabrication of the IC, but are most conveniently formed after the first layer of metallization is deposited and patterned. Although not illustrated, the IC fabrication continues in the normal manner with the formation of multiple layers of metallization, interlayer dielectrics, and the like. A plurality of spaced apart solder bumps 60 are attached to the front surface of the IC, at least some of which are in electrical contact with the conductive material in the filled vias and in electrical contact to components of the IC.

Figure 2:
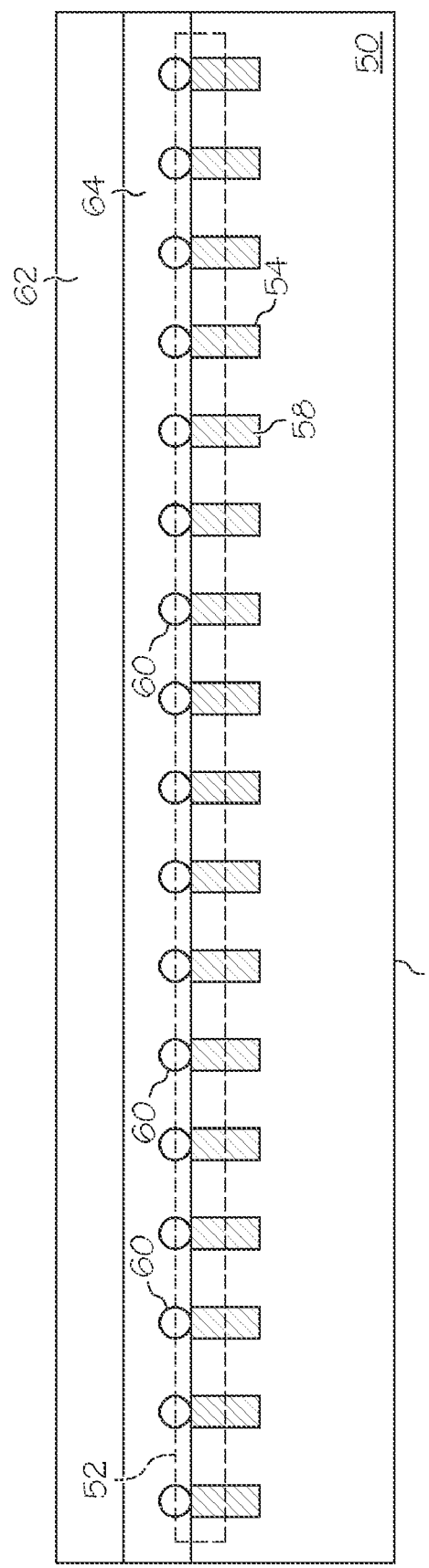

In accordance with one embodiment, the method continues as illustrated in FIG. 2 by bonding the front surface of the semiconductor substrate to a carrier wafer 62. Semiconductor substrate 50 and carrier wafer 62 are bonded together by an adhesive layer 64. The carrier wafer serves as a support as the back surface 66 of the semiconductor substrate is polished, for example by chemical mechanical polishing (CMP) to thin the substrate as illustrated in FIG. 3. During the polishing the portion of semiconductor substrate 50 that is indicated by dashed lines 68 is removed to expose a portion of conductive material 58 in via openings 54, thus completing the formation of the TSVs. It will be appreciated by those of skill in the art that the thinned semiconductor substrate will have a thickness of only 50-75 μm, consistent with the depth of the via openings, and it is this thinness that invites the use of carrier wafer 62.

Processing of the now-thinned back surface of semiconductor substrate 50 continues, in accordance with one embodiment, as illustrated in FIG. 4. Back surface 66 is cleaned, and although not shown in this cross-sectional view, a metallized redistribution layer (RDL) may be applied to the surface if necessary for the IC system being implemented. The RDL, if used, electrically contacts at least some of the TSVs. Spaced apart back side solder bumps 72 are attached to the back surface of the substrate in electrical contact with the RDL and/or the TSVs.

Figure 5:
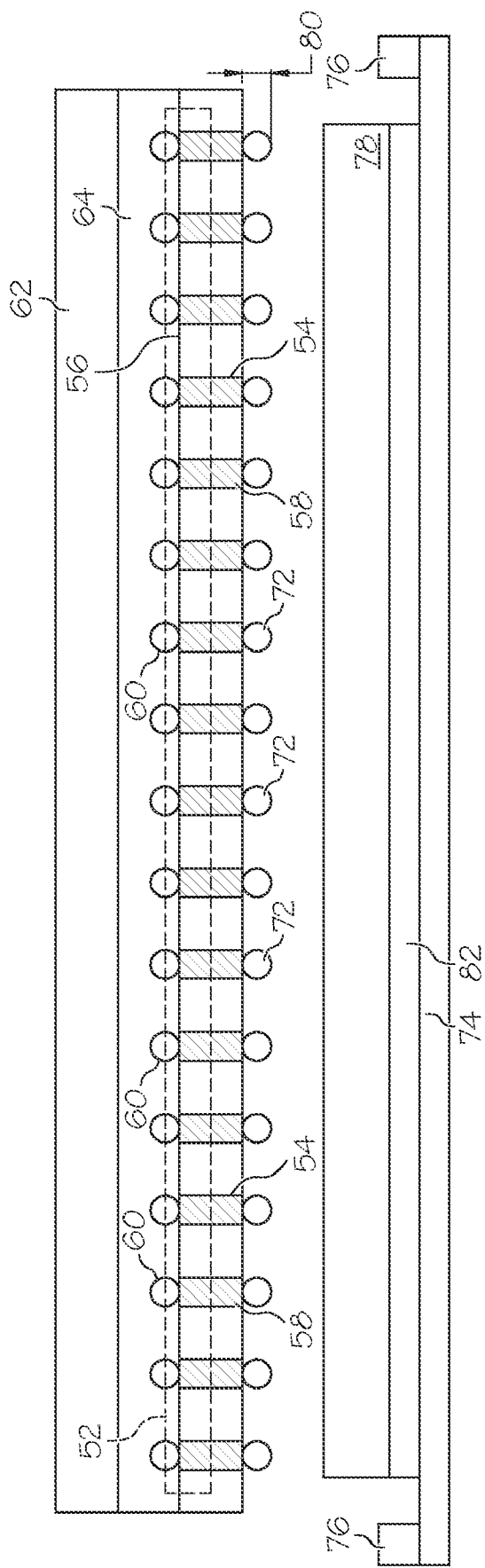

As illustrated in FIG. 5, a dicing tape 74 is provided, preferably stretched over a dicing tape frame 76. Dicing tape, as is well known, is typically a polymeric material used to hold the pieces of a semiconductor substrate together during and after a dicing operation in which the semiconductor substrate is divided into individual IC chips or dice. A layer of under-fill material 78 is applied to the surface of the dicing tape. In contrast to the presently disclosed method, in conventional processing the under-fill material is applied by a capillary under-fill process only after the chip has been attached to a substrate. The under-fill material, as is well known to those of skill in the art, is an electrically insulating material used to provide a strong mechanical connection between the IC chip and a substrate to which the IC chip will be bonded as explained below. The under-fill material also seals out contaminants and forms a heat bridge between the chip and substrate. Under-fill material 78 preferably has a thickness equal to or greater than the height of the spaced apart back side solder bumps as indicated by arrows 80. The under-fill material is typically a polymeric material and is only partially cured so that it remains plastic at this stage of the processing. An ultra violet (UV) release layer 82 may also be included between the dicing tape and the layer of under-fill material.

Figure 6:
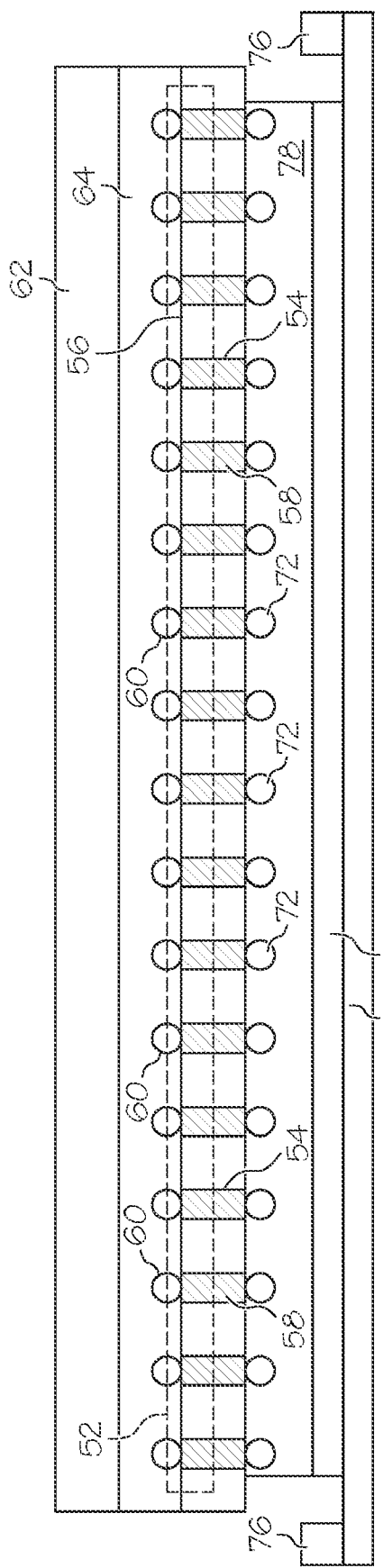

The method continues, in accordance with one embodiment, by laminating back surface 66 of semiconductor substrate 50 to dicing tape 74 and the layer of under-fill material 78 as illustrated in FIG. 6. The partially cured under-fill material surrounds and fills the spaces between the back side solder bumps 72. The lamination is accomplished in the same manner as is conventionally done without the layer of under-fill material.

Figure 7:
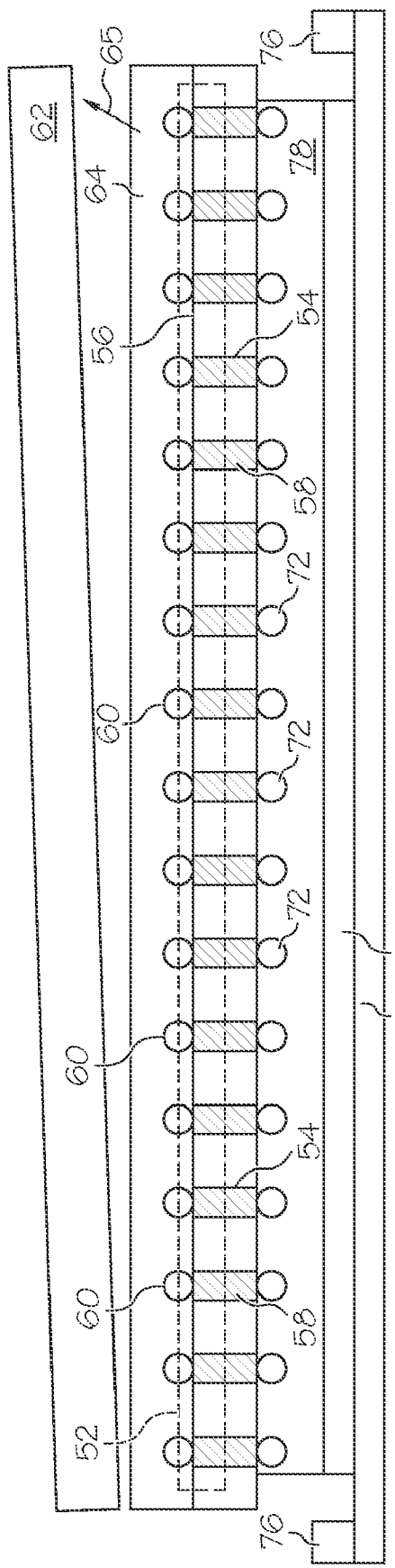

As illustrated in FIG. 7, once semiconductor substrate 50 is laminated to dicing tape 74 and layer of under-fill material 78, the semiconductor substrate can be debonded from carrier wafer 62 as the thinned substrate is now supported by the dicing tape and dicing tape frame. After removing carrier wafer 62, adhesive layer 64 is removed from the front surface of the semiconductor substrate (the subsequent removal of the adhesive is represented by arrow 65) and the surface is thoroughly cleaned.

Figure 8:
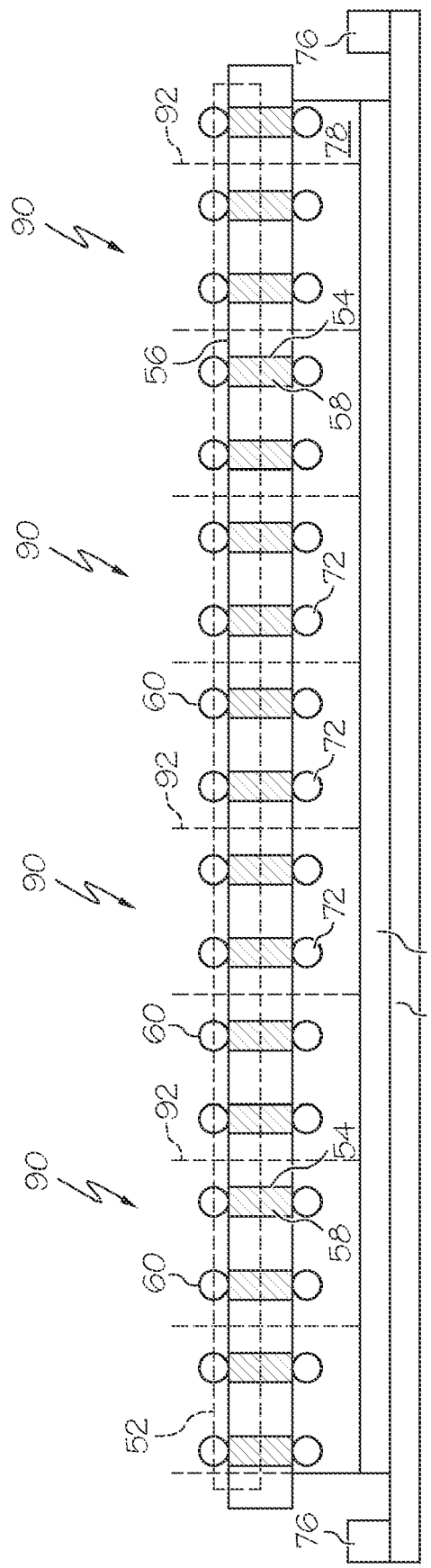

After cleaning the surface of semiconductor substrate 50, the substrate can be diced into individual integrated circuit chips or dice 90 as illustrated in FIG. 8. The semiconductor substrate can be diced by sawing, scribing, or laser cutting along the scribe lines between the individual IC chips as indicated by the dotted lines 92. The dicing operation cuts through the semiconductor substrate, layer of under-fill material 78, and into dicing tape 74. Although in the simplified cross-sectional illustration only two solder bumps 60 are shown on the front of the semiconductor substrate and only two back side solder bumps 72 are shown on the back side, in actual practice any number of solder bumps, often in the hundreds, both front side and back side, can be used as required to implement the integrated circuit as designed.

As illustrated in FIG. 9, the method continues by singulation and removal of individual integrated circuit chips such as IC chip 94 from the dicing tape. The individual chips can be removed, for example, by robotically controlled pick and place equipment. If a UV release layer 82 has been incorporated into the structure underlying the layer of under-fill material, the individual IC chips can be released from the dicing tape for removal by irradiating the dicing tape, preferably from the back side, by UV radiation. The UV radiation causes the under-fill material to be released from the dicing tape. After release from the dicing tape, IC chip 94 includes a completed integrated circuit with solder bumps on a surface thereof, the solder bumps 72 enclosed in a partially cured under-fill material 78.

IC chip 94 is attached to another substrate 96-1 or 96-2 (collectively substrate 96) to complete the integrated circuit system as illustrated in FIG. 10. Substrate 96 can be an interposer substrate or a printed circuit board 96-1 as illustrated in FIG. 10A, or another integrated circuit chip 96-2 as illustrated in FIG. 10B. IC chip 94 can be used alone in the IC system or can be one of a plurality of IC chips that are assembled together to form the system. A plurality of IC chips can be attached to the same interposer substrate or printed circuit board and/or a plurality of IC chips can be stacked, one upon another, in a three dimensional stack to form the IC system.

IC chip 94 is attached to substrate 96 by aligning back side solder bumps 72 with metallic pads 98 on substrate 96-1 as in FIG. 10A or by aligning solder bumps 72 with metallic pads 98 (not illustrated) or solder bumps 73 on the surface of an IC substrate 96-2 as in FIG. 10B. The solder bumps are electrically connected to metallic pads 98 or to solder bumps 73 by heating the solder and causing it to flow. Preferably the solder bumps are connected to the metallic pads or solder bumps 73 by a thermal-compression (TC) bonding process. In the TC bonding process the heat required to cause the solder to flow is combined with a compressive force. As IC chip is positioned over substrate 96 and the solder bumps are pressed against the metallic pads or solder bumps 73 as indicated by arrow 100, the partially cured under-fill material under the solder bumps deforms to allow contact between solder bumps and the metallic pads or solder bumps 73. After bonding, the under-fill material 78 is heated to completely cure the material to form a protective layer surrounding the solder bump connections and mechanically securing the IC chip to the substrate.

Although not illustrated, a three dimensional stack of a plurality of IC chips fabricated and assembled as described above can also be flip chip bonded to a substrate such as a printed circuit board to complete a three dimensional IC system. Solder bumps 60 on the front of one of the plurality of IC chips can be attached to conductive pads on a substrate in the same manner as described for the back side solder bumps.

Figure 11:
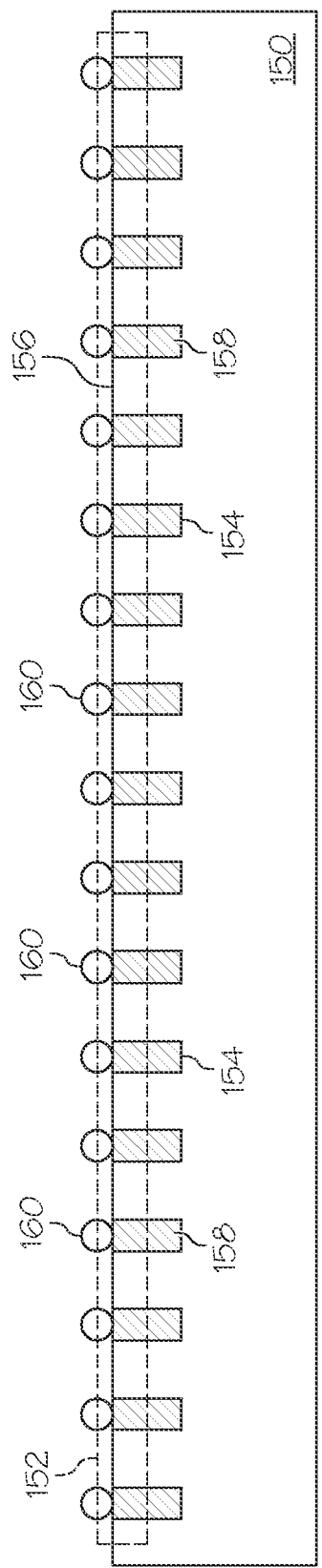
FIGS. 11 and 12 schematically illustrate, in simplified cross-sectional views, method steps for fabricating an integrated circuit system in accordance with alternate embodiments.
Figure 12:
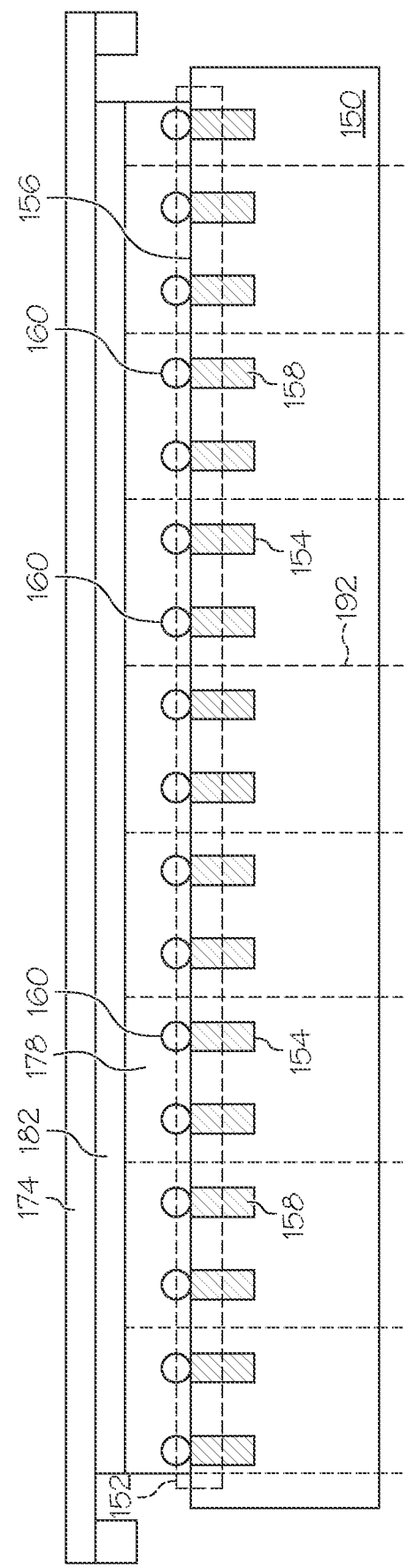

The methods described above for laminating the back surface of a semiconductor substrate to a dicing tape covered with a layer of under-fill material can also be applied to flip chip bonding the front surface of a solder bumped integrated circuit to another substrate as illustrated in FIGS. 11 and 12. ICs 152 are fabricated in and on a semiconductor substrate 150 including the attachment of solder bumps 160 to the front surface 156 in electrical contact to portions of the IC as illustrated in FIG. 11. The integrated circuits may also include, in some embodiments, TSVs formed from via openings 154 filled with conductive material 158.

The front surface of the semiconductor substrate is laminated to a dicing tape 174 upon which a layer of under-fill material 178 has been provided as illustrated in FIG. 12. In accordance with one embodiment a release layer 182 is positioned between the dicing tape and the layer of under-fill material. The semiconductor substrate, whether thinned or not, can be diced along the scribe lines to separate the plurality of ICs as indicated by the dotted lines 192.

After dicing the individual ICs can be singulated and removed from the dicing tape in the same manner as described above with respect to FIGS. 9 and 10. Pick and place equipment can remove individual chips from the dicing tape and position them over conductive bonding pads on a printed circuit board. The solder bumps are heated, preferably by a thermal compression bonding process, to flow the solder and join the solder bumps to the conductive pads. The under-fill material is cured, as described above, to complete the process.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A method for fabricating an integrated circuit system comprising:
   fabricating a plurality of integrated circuits in and on a semiconductor substrate;
   attaching spaced apart solder bumps to the plurality of integrated circuits, the solder bumps in electrical contact to components of the integrated circuits;
   providing a dicing tape having a layer of under-fill material thereon;
   laminating the semiconductor substrate to the dicing tape with the layer of under-fill material filling spaces between the solder bumps;
   dicing the semiconductor substrate and layer of under-fill material to singulate individual ones of the plurality of integrated circuits; and
   attaching one of the individual ones of the plurality of integrated circuits to a second substrate.

2. The method of claim 1 wherein providing a dicing tape comprises providing a dicing tape having a layer of under-fill material thereon, the layer of under-fill material having a thickness equal to or greater than the height of the spaced apart solder bumps.

3. The method of claim 1 wherein providing a dicing tape comprises providing a dicing tape having an ultra violet release layer underlying the layer of under-fill material.

4. The method of claim 3 wherein, after dicing the semiconductor substrate and layer of under-fill material, exposed the dicing tape to ultra violet radiation to cause the under-fill material to release from the dicing tape.

5. The method of claim 1 further comprising, after attaching one of the individual ones of the plurality of integrated circuits to a second substrate, heating the one of the plurality of integrated circuits to cure the under-fill material.

6. The method of claim 1 wherein attaching one of the individual ones of the plurality of integrated circuits to a second substrate comprises attaching one of the individual ones to a second integrated circuit chip to form a three dimensional integrated circuit system.

7. The method of claim 1 wherein the spaced apart solder bumps are located on a back surface of the semiconductor substrate and wherein fabricating a plurality of integrated circuits further comprises forming through substrate vias extending through the semiconductor substrate and electrically coupled to the spaced apart solder bumps.

8. The method of claim 7 wherein fabricating a plurality of integrated circuits further comprises:
   temporarily bonding the semiconductor substrate to a carrier wafer; and
   thinning the semiconductor substrate before attaching the spaced apart solder bumps.

9. The method of claim 8 further comprising debonding the semiconductor substrate from the carrier wafer after laminating the semiconductor substrate to the dicing tape.

10. A method for fabricating an integrated circuit system comprising:
    fabricating integrated circuits in and on a semiconductor substrate including etching via openings into a front surface of the semiconductor substrate and filling the via openings with a conductive material to form through substrate vias;

bonding the front surface of the semiconductor substrate to a carrier wafer;

polishing a back side of the semiconductor substrate to expose a portion of the conductive material;

forming a plurality of solder bumps on the back side in electrical contact with the conductive material;

providing a dicing tape having a layer of under-fill material thereon;

laminating the back side of the semiconductor substrate to the dicing tape;

debonding the semiconductor substrate from the carrier wafer;

dicing the semiconductor substrate and layer of under-fill material into individual integrated circuit chips; and assembling the individual integrated circuit chips and under-fill material on a second substrate.

11. The method of claim 10 further comprising forming a redistribution layer on the back side of the semiconductor substrate before forming the plurality of solder bumps, the redistribution layer electrically coupled between the conductive material and the plurality of solder bumps.

12. The method of claim 10 wherein providing a dicing tape comprises providing a dicing tape having a UV release layer between the dicing tape and the layer of under-fill material.

13. The method of claim 12 further comprising irradiating the dicing tape with UV radiation after dicing to release the individual integrated circuit chips and a portion of the under-fill material from the dicing tape.

14. The method of claim 10 wherein assembling the individual integrated circuit chips and under-fill material on a second substrate comprises:

positioning an individual integrated circuit chip over a second substrate;

heating the individual integrated circuit chip to cause the solder bumps to flow and cause an electrical coupling to conductive pads on the second substrate; and heating the under-fill material to cure the under-fill material.

15. The method of claim 10 wherein assembling the individual integrated circuit chips and under-fill material on a second substrate comprises attaching an individual integrated circuit chip to a second integrated circuit chip to form a three dimensional integrated circuit system.

16. A method for fabricating an integrated circuit system comprising:

fabricating a plurality of integrated circuits in and on a semiconductor substrate, each of the integrated circuits including a plurality of metal filled vias extending from a front surface toward a back surface and a plurality of solder bumps on the front surface, each in electrical contact with one of the plurality of metal filled vias;

bonding the front surface to a carrier wafer;

polishing the back surface to thin the semiconductor substrate and to expose a portion of the plurality of metal filled vias;

forming a redistribution layer on the back surface in electrical contact with the exposed portion of the plurality of metal filled vias;

forming a plurality of back side solder bumps in electrical contact with the redistribution layer;

providing a dicing tape having a layer of under-fill material thereon;

laminating the back surface of the semiconductor substrate to the dicing tape, the under-fill material filling spaces between the back side solder bumps;

removing the carrier wafer;

dicing the semiconductor substrate and the layer of under-fill material to separate the plurality of integrated circuits into a plurality of individual integrated circuits; and attaching one of the plurality of individual integrated circuits to a second substrate and heating to cause the plurality of back side solder bumps to flow and to adhere to metallic pads on the second substrate.

17. The method of claim 16 wherein attaching further comprises heating the one of the plurality of individual integrated circuits and the under-fill material to cure the under-fill material.

18. The method of claim 16 wherein providing a dicing tape comprises providing a dicing tape having an under-fill layer thereon, the under-fill layer having a thickness at least equal to the height of the back side solder bumps.

19. The method of claim 16 wherein attaching one of the plurality of individual integrated circuits to a second substrate comprises attaching the one of the plurality of individual integrated circuits to a second integrated circuit chip, the method further comprising flip chip bonding the solder bumps on the front surface to a printed circuit board.

20. The method of claim 16 wherein providing a dicing tape further comprises providing a dicing tape having a UV release layer between the dicing tape and the layer of under-fill material.

* * * * *